United States Patent
Liu et al.

(10) Patent No.: US 11,764,057 B2
(45) Date of Patent: Sep. 19, 2023

(54) METHOD OF FORMING STRUCTURE HAVING COATING LAYER AND STRUCTURE HAVING COATING LAYER

(71) Applicant: CHE Inc., Kaohsiung (TW)

(72) Inventors: Chuan-Pu Liu, Tainan (TW); Yin-Wei Cheng, Kaohsiung (TW); Shih-An Wang, Taipei (TW); Bo-Liang Peng, Kaohsiung (TW); Chun-Hung Chen, New Taipei (TW); Jun-Han Huang, Changhua County (TW); Yi-Chang Li, Changhua (TW)

(73) Assignee: CHE Inc., Kaohsiung (TW)

( * ) Notice: Subject to any disclaimer, the term of this patent is extended or adjusted under 35 U.S.C. 154(b) by 0 days.

(21) Appl. No.: 17/327,786

(22) Filed: May 24, 2021

(65) Prior Publication Data

US 2022/0375748 A1 Nov. 24, 2022

(51) Int. Cl.
*H01L 21/02* (2006.01)

(52) U.S. Cl.
CPC .... *H01L 21/02282* (2013.01); *H01L 21/0245* (2013.01); *H01L 21/02428* (2013.01); *H01L 21/02532* (2013.01); *H01L 21/02601* (2013.01)

(58) Field of Classification Search
CPC ......... H01L 21/02282; H01L 21/02428; H01L 21/0245; H01L 21/02532; H01L 21/02601; H01L 21/02491; H01L 21/0243; H01L 21/02628; H01L 21/73; C23C 18/00
See application file for complete search history.

(56) References Cited

U.S. PATENT DOCUMENTS

| | | | |
|---|---|---|---|
| 5,332,601 A | | 7/1994 | Varacalle, Jr. et al. |
| 5,804,473 A | * | 9/1998 | Takizawa .......... H01L 21/02579 257/E21.414 |
| 6,878,184 B1 | * | 4/2005 | Rockenberger ....... B22F 1/0545 75/343 |
| 7,701,011 B2 | * | 4/2010 | Kamath .............. H01L 27/1292 438/149 |
| 2008/0179652 A1 | | 7/2008 | Sugioka |
| 2010/0029057 A1 | * | 2/2010 | Iwasawa ........... H01L 21/02348 423/325 |
| 2020/0024722 A1 | * | 1/2020 | Yu ........................ H01L 21/2855 |

FOREIGN PATENT DOCUMENTS

| | | |
|---|---|---|
| CN | 101289739 | 10/2008 |
| CN | 101516970 A | 8/2009 |
| CN | 106459462 | 2/2017 |
| CN | 107630184 | 1/2018 |
| CN | 107675120 | 2/2018 |

(Continued)

*Primary Examiner* — Dale E Page
*Assistant Examiner* — Quovaunda Jefferson
(74) *Attorney, Agent, or Firm* — LAW OFFICE OF MICHAEL CHEN; Che Yang Chen

(57) ABSTRACT

A method of forming a structure having a coating layer includes the following steps: providing a substrate; coating a fluid on the surface of the substrate, where the fluid includes a carrier and a plurality of silicon-containing nanoparticles; and performing a heating process to remove the carrier and convert the silicon-containing nanoparticles into a silicon-containing layer, a silicide layer, or a stack layer including the silicide layer and the silicon-containing layer.

7 Claims, 20 Drawing Sheets

(56) References Cited

FOREIGN PATENT DOCUMENTS

| CN | 107675121 | | 2/2018 |
|---|---|---|---|
| CN | 105543840 | | 3/2018 |
| KR | 10-2008-0086114 | * | 9/2008 |
| TW | 201302478 A1 | | 1/2013 |
| TW | 1591837 | | 7/2017 |
| WO | WO9209100 | | 5/1992 |

* cited by examiner

METHOD OF FORMING STRUCTURE HAVING COATING LAYER AND STRUCTURE HAVING COATING LAYER

BACKGROUND OF THE PRESENT INVENTION

Field of Invention

The present invention relates to a method of forming a structure with a coating layer and a structure with a coating layer, and more particularly to a method of forming a structure with a coating layer with good gap filling ability and adhesion and to a structure formed by the method.

Description of Related Arts

In the coating process, in order to form a film on the substrate, the mainstream method includes using a coating technology, such as physical vapor deposition (PVD) and chemical vapor deposition (CVD), to form a film on the substrate.

For current coating technology, however, when there are grooves, especially grooves with small opening area (for example, with a diameter less than 500 nm) and aspect ratio greater than 2, on the surface of the substrate, the current coating technology cannot provide good gap filling ability. Therefore, the conventional coating technology cannot provide good quality of a coating layer.

In addition, when the thickness of the coating layer is thick, it usually takes a long deposition time to form a uniform and thick deposited film. However, for the thick coating layer, the coating layer may be peeled off from the surface of the substrate due to the internal stress of the coating layer generated during the deposition process or the low surface energy of the surface of the substrate.

SUMMARY OF THE PRESENT INVENTION

In view of this, embodiments of the present disclosure disclose a method of forming a structure with a coating layer and a structure with a coating layer in order to solve the above drawbacks.

According to one embodiment of the present disclosure, a method of forming a structure with a coating is disclosed, which includes: providing a substrate; coating a fluid on the surface of the substrate, where the fluid includes a carrier and a plurality of silicon-containing nanoparticles; and performing a heating process to remove the carrier and convert the silicon-containing nanoparticles into a silicon-containing layer, a silicide layer, or a stack layer including the silicide layer and the silicon-containing layer.

According to another embodiment of the present disclosure, a coated structure is disclosed, which includes: a substrate comprising a plurality of grooves, wherein an aspect ratio of each groove is greater than 2; a silicon-containing layer filling the grooves; and a silicide layer extending between the substrate and the silicon-containing layer and covering an inner wall of each groove.

By referring to the following embodiments, those with ordinary skill in the art to which the present invention pertains can easily understand the basic spirit of the present invention and other inventive purposes, as well as the technical means and implementation aspects adopted by the present invention.

DETAILED DESCRIPTION OF THE PREFERRED EMBODIMENT

The detailed description provided below in connection with the appended drawings is intended as a description of the embodiments and is not intended to represent the only forms in which the present embodiments may be constructed or utilized. The description sets forth the features of the embodiments as well as the steps and their sequence for operating the embodiments. However, the same or equivalent functions, steps and sequences may also be accomplished by other embodiments.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means in 10%, 5%, 1%, or 0.5% of a given value or range. Alternatively, the term "about" means in an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that may vary as desired. At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
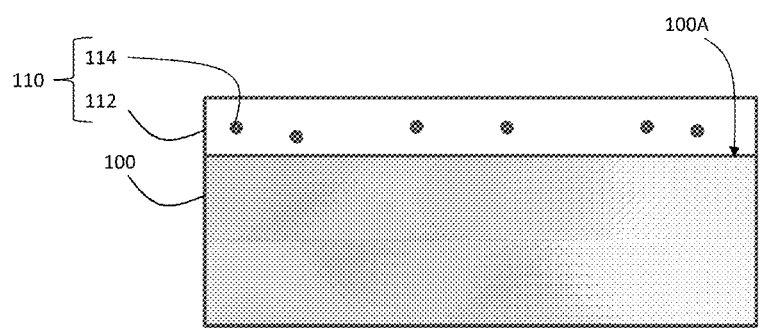
FIG. 1 is a cross-sectional view of a substrate provided with fluid according to one embodiment of the present invention.

FIG. 1 is a cross-sectional view of a substrate provided with fluid according to one embodiment of the present invention. Referring to FIG. 1, at the initial stage of forming a structure with a coating layer, a substrate 100 is provided. The substrate 100 may be made of metal material, semiconductor material, insulator material or nonmetal material. For example, metal material may includes copper (Cu), iron (Fe), nickel (Ni) or molybdenum (Mo), nonmetal material may includes graphite (C), insulator material may include aluminum oxide, and semiconductor material may include zinc oxide, gallium nitride or aluminum oxide. According to one embodiment of the present disclosure, the substrate 100 may be made of a heat-resistant material, for example, a material that may not be deformed or denatured at a temperature of 500° C.-1500° C.

Then, fluid 110 may be coated on the surface 100A of the substrate 100, so that the fluid 110 completely covers the surface 100A of the substrate 100. According to one embodiment of the present disclosure, a spin coating process or other suitable processes can be used to completely cover the surface 100A of the substrate 100 with the fluid 110. The fluid 110, which may be colloidal or slurry, includes a carrier 112 and a plurality of silicon-containing nanoparticles 114 dispersed in the carrier 112. In addition, depending on actual requirements, the fluid 110 may also include acid liquid, alkali liquid, organic solvent or water, and the colloid may be sol, organic compound, polymer solution and association colloid. The carrier 112 may be a gas or a liquid. The silicon-containing nanoparticles 114 can be crystalline silicon nanoparticles or amorphous silicon nanoparticles, and the size of the silicon-containing nanoparticles 114 can range from 1 nm to 300 nm, such as 20 nm, 30 nm, 100 nm, 200 nm, or any of them. According to one embodiment of the present disclosure, a native oxide layer may exist on the surface of the silicon-containing nanoparticles 114, but the thickness of the native oxide layer is preferably less than 10 nm, for example, 5 nm. It should be noted that the number of silicon-containing nanoparticles 114 shown in FIG. 1 is for illustrative purpose, and the actual number thereof can be adjusted according to the requirements.

Figure 2:
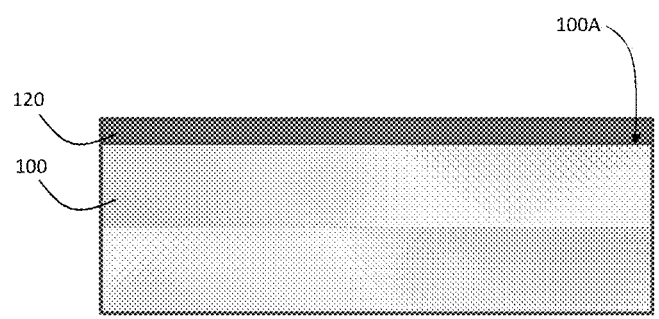
FIG. 2 is a cross-sectional view of a substrate provided with a silicon-containing layer according to one embodiment of the present invention.

After the fluid 110 completely covers the surface 100A of the substrate 100, a heating process may be performed to form the structure including the silicon-containing layer shown in FIG. 2. FIG. 2 is a cross-sectional view of a substrate provided with a silicon-containing layer according to one embodiment of the present invention. Referring to FIG. 2, during the heating process, the carrier 112 can be removed, and the silicon-containing nanoparticles 114 can be converted into a silicon-containing layer 120, which can be used as a coating layer of the substrate 100. According to one embodiment of the present disclosure, the heating process includes a vacuum heating process, such as a vacuum heating process at a pressure of $1 \times 10^{-2}$ torr to $10 \times 10^{-1}$ torr and a temperature of 500° C.-2000° C. By performing the heating process, the silicon-containing nanoparticles 114 can be sintered to produce a polycrystalline structure, such as a polycrystalline silicon structure.

According to some embodiments of the present invention, the carrier 112 can not only be used to disperse the silicon-containing nanoparticles 114, but also be corrosive to the substrate 100. Thus, it can be used to increase the roughness of the surface of the substrate 100. Accordingly, during the heating process, the roughened surface 100A of the substrate 100 can produce a larger contact area with the silicon-containing layer 120, thereby increasing the adhesion between the substrate 100 and the silicon-containing layer 120.

Figure 3:
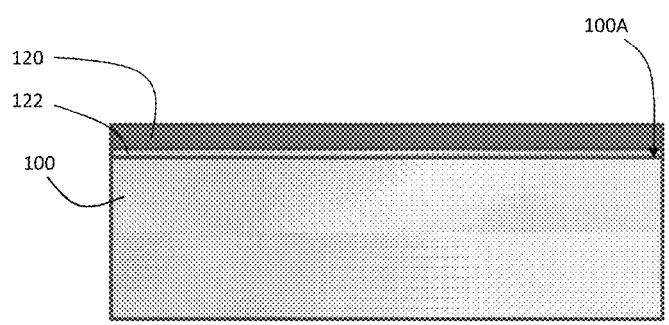
FIG. 3 is a cross-sectional view of a substrate provided with metal silicide according to one embodiment of the present invention.

FIG. 3 is a cross-sectional view of a substrate provided with metal silicide according to one embodiment of the present invention. Referring to FIG. 3, the structure of FIG. 3 is similar to that shown in FIG. 2, and the main difference is that the substrate 100 shown in FIG. 3 further includes a silicide layer 122, for example, the silicide layer 122 disposed between the substrate 100 and the silicon-containing layer 120, so the silicide layer 122 and the silicon-containing layer 120 can be regarded as a stacked layer disposed on the substrate 100. The silicide layer 122 can also be formed by the above heating process. For example, during the heating process, the silicon-containing nanoparticles 114 in the fluid 110 can react with the substrate 100 to form the silicide layer 122. The silicide layer 122 may include binary compounds composed of silicon and some main group elements (such as Group 1, 2, 13, 14, 15, 16, and 17 elements) or some transition metals, such as NiSi, $Cu_5Si$, CoSi, $Mo_5Si$, FeSi, SiC and so forth. Because the characteristics of the binary compounds are different, for example, a molybdenum silicide layer can have higher hardness than a molybdenum substrate, while silicon carbide layer can have higher hardness and insulation than a carbon substrate. Therefore, characteristics of the modified substrate 100 which are different from those of the original substrate 100 can be produced by forming the silicide layer 122 on the substrate 100. According to another embodiment of the present disclosure, all the silicon-containing layers 120 on the substrate 100 may be reacted and converted into the silicide layer 122, so that no silicon-containing layer 120 would remain on the substrate 100 after forming the silicide layer 122.

Figure 4:
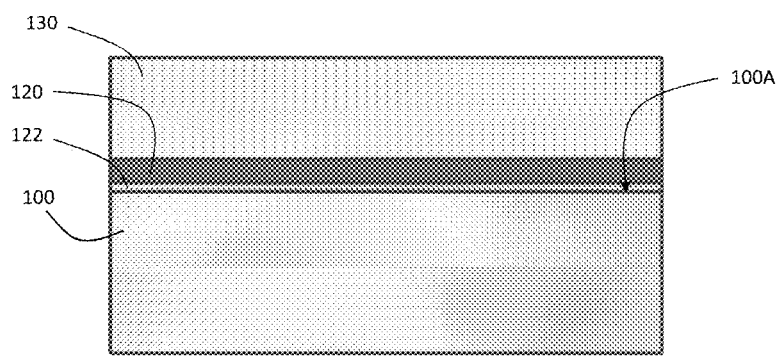
FIG. 4 is a cross-sectional view of a silicon-containing layer provided with a semiconductor layer according to one embodiment of the present invention.

FIG. 4 is a cross-sectional view of a silicon-containing layer provided with a semiconductor layer according to one embodiment of the present invention. After the structure shown in FIG. 3 is completed, the silicon-containing layer 120 can be optionally planarized, and then another deposition process or coating process can be performed to form a semiconductor layer 130. The metal silicide layer 122 generated by the reaction between the silicon-containing layer 120 and the substrate 100 can improve the adhesion strength between the silicon-containing layer 120 and the substrate 100, so that the silicon-containing layer 120 may not peel off from the substrate 100 even though the semiconductor layer 130 disposed above the silicon-containing layer 120 may apply stress to the silicon-containing layer 120 or the substrate 100.

Figure 5:
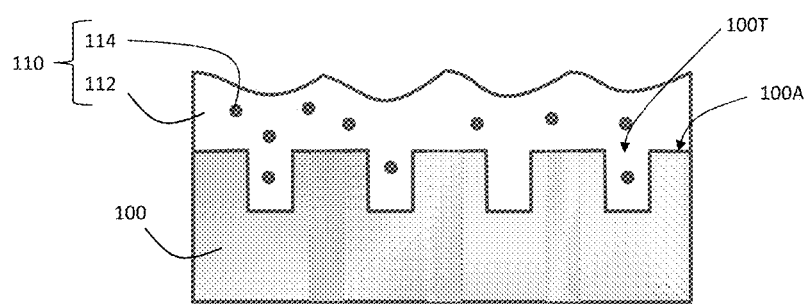
FIG. 5 is a cross-sectional view of a substrate provided with fluid according to one embodiment of the present invention.

In addition to the above embodiments, the substrate 100 may also be a substrate 100 including a plurality of grooves 100T. FIG. 5 is a cross-sectional view of a substrate provided with fluid according to one embodiment of the present invention. Referring to FIG. 5, at the initial stage of forming a structure with a coating layer, a substrate 100 is provided, and the surface 100A of the substrate 100 includes a plurality of grooves 100T.

Then, fluid 110 may be coated or sprayed on the surface 100A of the substrate 100, so that the fluid 110 completely covers the surface 100A of the substrate 100 and fills the grooves 100T. According to one embodiment of the present disclosure, a spin coating process, an air spray process, or other suitable processes can be used to completely cover the surface 100A of the substrate 100 with the fluid 110. The fluid 110 can be colloid, aerosol or slurry, which includes a carrier 112 and a plurality of silicon-containing nanoparticles 114 dispersed in the carrier 112. In addition, depending on actual requirements, the fluid 110 may also include acid liquid, alkali liquid, organic solvent, water and so forth. The colloid may be sol, organic compound, polymer solution or association colloid. The carrier 112 may be gas or liquid. The silicon-containing nanoparticles 114 can be crystalline silicon nanoparticles or amorphous silicon nanoparticles, and the sizes of the silicon-containing nanoparticles 114 can range from 1 nm to 300 nm, such as 20 nm, 30 nm, 100 nm, 200 nm, or any of them. According to one embodiment of the present disclosure, a native oxide layer may exist on the surface of the silicon-containing nanoparticles 114, but the thickness of the native oxide layer is preferably less than 10 nm, for example, 5 nm. It should be noted that the number of silicon-containing nanoparticles 114 shown in FIG. 5 is for illustrative purposes only, and the actual number of the particles can be adjusted according to the requirements.

Figure 6:
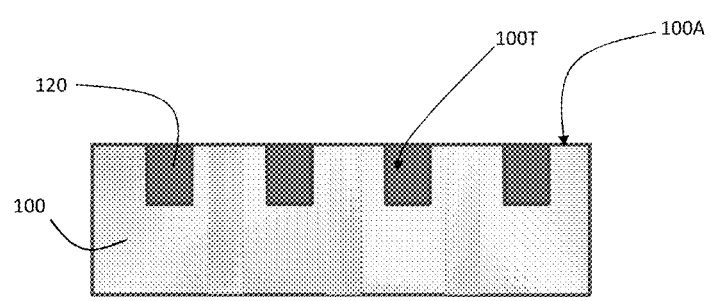
FIG. 6 is a cross-sectional view of a substrate provided with a silicon-containing layer according to one embodiment of the present invention.

After the fluid 110 completely covers the surface 100A of the substrate 100, the portions of the fluid 110 that cover the surface 100A of the substrate 100 may be removed, thereby leaving only the fluid 110 that is already filled in the groove 100T. According to one embodiment of the present disclosure, the portions of the fluid 110 covering the surface 100A of the substrate 100 can be removed by using a doctor blade removal process or other suitable removal processes, and the other portions of the fluid 110 can remain in the groove 100T. Thereafter, a heating process may be performed to remove the carrier 112 and convert the silicon-containing nanoparticles 114 into a silicon-containing layer so as to form the structure including the silicon-containing layer 120 shown in FIG. 6. FIG. 6 is a cross-sectional view of a substrate provided with a silicon-containing layer according to one embodiment of the present invention. Referring to FIG. 6, by performing the heating process, the silicon-containing layer 120 can be used as a coating layer and fill each groove 100T. Besides, the silicon-containing layer 120 does not include any voids. The silicon-containing layer 120 can be used as a coating layer of the substrate 100, and the surface topography of the silicon-containing layer 120 can be different from the surface topography of the original substrate 100. According to one embodiment of the present disclosure, the heating process includes a vacuum heating process, such as a vacuum heating process at a pressure of $1 \times 10^{-2}$ torr to $10 \times 10^{-1}$ torr and a temperature of 500° C.-2000° C. By performing the heating process, the silicon-containing nanoparticles 114 can be sintered to produce a polycrystalline structure, such as a polycrystalline silicon layer. According to one embodiment of the present disclosure, the silicon-containing layer 120 is not limited to being disposed in the groove 100T, but can completely cover the substrate 100. Thus, the surface topography of the silicon-containing layer 120 can be different from the surface topography of the original substrate 100. In addition, the silicon-containing layers 120 filled in the groove 100T can also be regarded as a coating layer.

Figure 7:
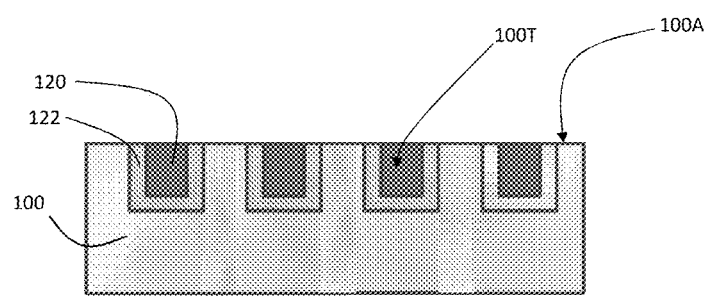
FIG. 7 is a cross-sectional view of metal silicide disposed in grooves according to one embodiment of the present invention.

FIG. 7 is a cross-sectional view of metal silicide disposed in grooves according to one embodiment of the present invention. The structure shown in FIG. 7 is similar to the structure shown in FIG. 6, and the main difference between them is that a silicide layer 122 is further disposed between the substrate 100 and the silicon-containing layer 120. For example, referring to FIGS. 5 and 7, after the fluid 110 completely covers the surface 100A of the substrate 100 shown in FIG. 5, the portion of the fluid 110 covering the surface 100A of the substrate 100 is removed, leaving only the fluid 110 filled in the groove 100T. According to one embodiment of the present disclosure, the portion of the fluid 110 covering the surface 100A of the substrate 100 can be removed by using a doctor blade removal process or other suitable removal processes, and the fluid 110 filled in the groove 100T remains. Thereafter, a heating process may be performed to remove the carrier 112 and convert the silicon-containing nanoparticles 114 into a silicon-containing layer 120, thereby forming a stacked layer including the silicon-containing layer 120 and the silicide layer 122 as shown in FIG. 7. The metal silicide layer 122 can be formed by the above heating process and completely covers the inner wall of the groove 100T. For example, during the heating process, the silicon-containing nanoparticles 114 in the fluid 110 can react with the inner wall of the groove 100T to form the silicide layer 122. The silicide layer 122 may include binary compounds composed of silicon and some main group elements (such as Group 1, 2, 13, 14, 15, 16, and 17 elements) or some transition metals, such as NiSi, $Cu_5Si$, CoSi, $Mo_5Si_3$, FeSi and so forth, but not limited thereto.

Figure 8:
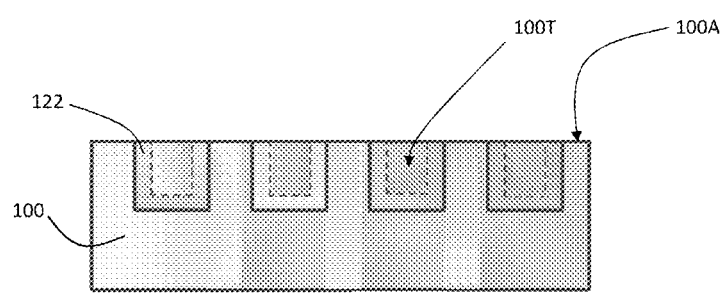
FIG. 8 is a cross-sectional view of metal silicide disposed in grooves according to another embodiment of the present invention.

FIG. 8 is a cross-sectional view of metal silicide disposed in grooves according to another embodiment of the present invention. The structure shown in FIG. 8 is similar to the structure shown in FIG. 7, and the main difference between them is that the silicon-containing layer in the groove 100T may be completely converted into the silicide layer 122, so that the silicide layer 122 can fill each groove 100T, and the silicide layer 122 in the groove 100T does not include any voids. For example, referring to FIGS. 5 and 8, after the fluid 110 completely covers the surface 100A of the substrate 100 shown in FIG. 5, the portion of the fluid 110 covering the surface 100A of the substrate 100 is removed, leaving only the portion of the fluid 110 filled in the groove 100T. According to one embodiment of the present disclosure, the portion of the fluid 110 covering the surface 100A of the substrate 100 can be removed by using a doctor blade removal process or other suitable removal processes, and the fluid 110 filled in the groove 100T remains. Thereafter, a heating process may be performed to remove the carrier 112 and convert the silicon-containing nanoparticles 114 into a silicide layer 122, thereby forming the structure including the silicide layer 122 shown in FIG. 8.

Figure 9:
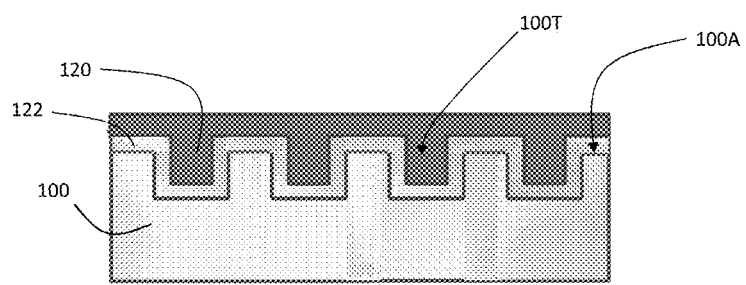
FIG. 9 is a cross-sectional view of metal silicide disposed in grooves according to another embodiment of the present invention.

FIG. 9 is a cross-sectional view of metal silicide disposed in grooves according to another embodiment of the present invention. The structure of FIG. 9 is similar to that shown in FIG. 7, and the main difference between these two structures is that the silicon-containing layer 120 and the silicide layer 122 are not only disposed in the grooves 100T, but also extend outwardly to cover the surface 100A of the substrate 100. Thus, the stacked layer composed of the silicon-containing layer 120 and the silicide layer 122 can provide a flat surface. For example, referring to FIGS. 5 and 9, the portion of the fluid 110 that covers the surface 100A of the substrate 100 shown in FIG. 5 can be retained completely without being removed. A heating process is then performed to remove the carrier 112, and the silicon-containing nanoparticles 114 are converted into a silicon-containing layer 120, and a silicide layer 122 is formed between the substrate 100 and the silicon-containing layer 120. The metal silicide layer 122 can be formed by the above heating process and can completely cover the surface 100A of the substrate 100 and the inner wall of the groove 100T, so as to form the stacked layer including the silicon-containing layer 120 and the metal silicide layer 122 shown in FIG. 9.

Specific examples for forming a structure with a coating layer are described below.

Example 1

Figure 10:
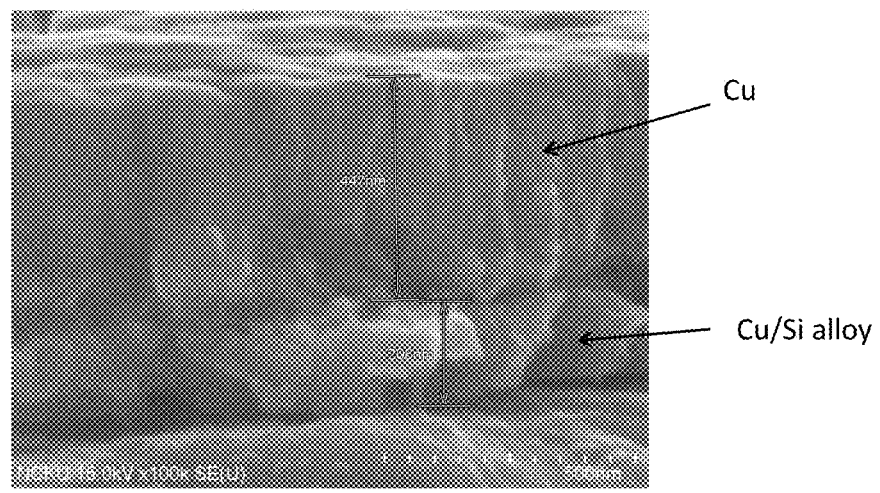
FIG. 10 is an SEM image corresponding to Example 1 of the present invention.

The silicon powder with the weight of 1 kg and the average particle size of 200 nm was added to 4 kg of de-ionized water, which was uniformly stirred by a DC mixer to prepare a silicon-containing fluid with a solid content of 20%. Then, after dripping the silicon-containing fluid onto the surface of copper (Cu) metal substrate, the surface of the copper (Cu) substrate was coated by applying a spin coating method at a maximum rotating speed of 1000 RPM. Then, the sample coated with the silicon-containing fluid was put into a high-temperature vacuum furnace. The pressure of the vacuum furnace was then down to $5\times10^{-1}$ torr, and the temperature of the furnace was increased to 700° C. and kept for 30 minutes so as to produce copper-silicon alloy on the surface of copper metal (metal substrate). The corresponding SEM image is shown in FIG. 10.

Example 2

Figure 11:
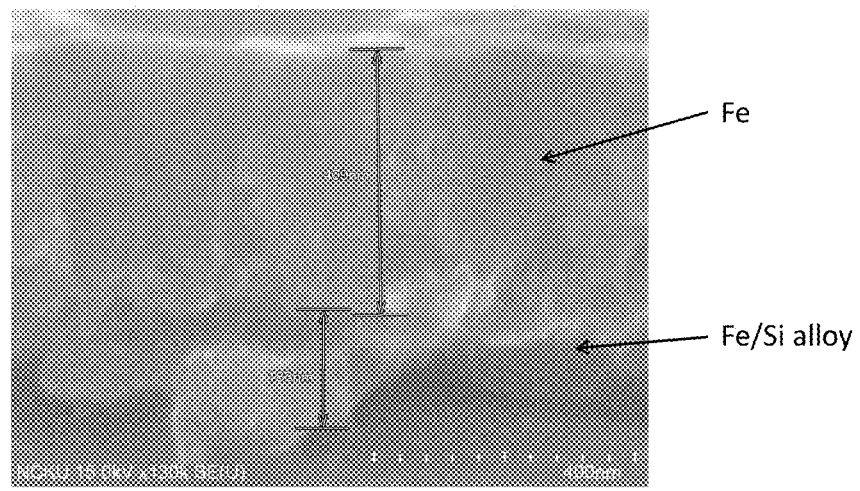
FIG. 11 is an SEM image corresponding to Example 2 of the present invention.

Silicon powder with a weight of 1 kg and an average particle size of 180 nm was added into 4 kg of de-ionized water, which was uniformly stirred by a DC mixer to prepare a silicon-containing fluid with a solid content of 20%. Then, the silicon-containing fluid is dripped onto the surface of iron (Fe) metal, and then the surface of iron (Fe) metal was coated by applying a spin coating method at a maximum rotating speed of 1000 RPM. After that, the sample coated with silicon-containing fluid was put into a high-temperature vacuum furnace. The pressure of the vacuum furnace was then down to $5\times10^{-1}$ torr, and the temperature of the furnace was increased to 900° C. and kept for 30 minutes so as to produce iron-silicon alloy on the surface of iron metal (metal substrate). The corresponding SEM image is shown in FIG. 11.

Example 3

Figure 12:
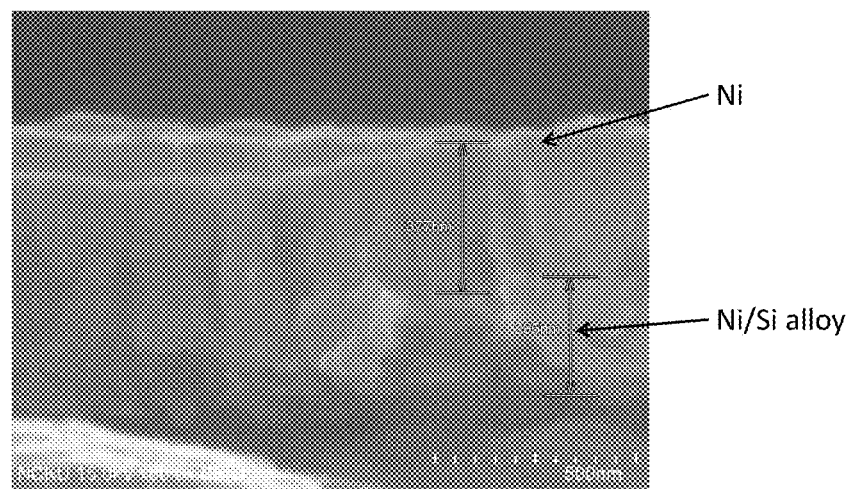
FIG. 12 is an SEM image corresponding to Example 3 of the present invention.

Silicon powder with a weight of 1 kg and an average particle size of 300 nm was added into 4 kg of de-ionized water, which was uniformly stirred by a DC mixer to prepare a silicon-containing fluid with a solid content of 20%. Then, the silicon-containing fluid was dripped onto the surface of nickel (Ni) metal substrate, and then the surface of nickel (Ni) metal was coated by a spin coating method at a maximum rotating speed of 1000 RPM. Then, the sample coated with the silicon-containing fluid was put into a high-temperature vacuum furnace. The pressure of the vacuum furnace was then down to $5\times10^{-1}$ torr, and the temperature of the furnace was increased to 1100° C. and kept for 30 minutes so as to produce nickel-silicon alloy on the surface of nickel metal (metal substrate). The corresponding SEM image is shown in FIG. 12.

Example 4

Figure 13:
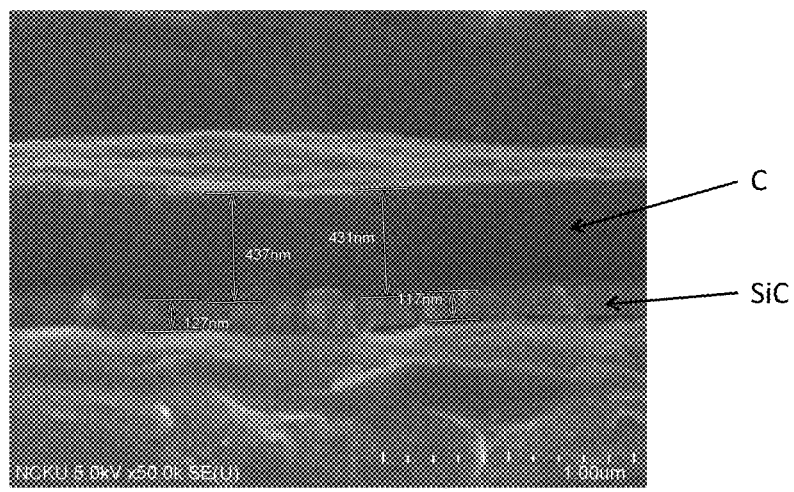
FIG. 13 is an SEM image corresponding to Example 4 of the present invention.

Silicon powder with a weight of 1 kg and an average particle size of 120 nm was added into 9 kg of de-ionized water, which was uniformly stirred by a DC mixer to prepare a silicon-containing fluid with a solid content of 10%. Then, the silicon-containing fluid was transported by high-pressure carrier gas to a nozzle outlet so that the silicon-containing fluid can be sprayed onto the surface of graphite (C). In this example, the carrier gas is argon with a gas pressure of 7 Bar. After forming a silicon film on the surface of graphite (C), the coated graphite was put into a high-temperature vacuum furnace. The pressure of the vacuum furnace was then down to $5\times10^{-1}$ torr, and the temperature of the furnace was increased to 1200° C. and kept for 30 minutes so as to produce silicon carbide on the surface of graphite (non-metallic substrate). The corresponding SEM image is shown in FIG. 13.

Example 5

Figure 14:
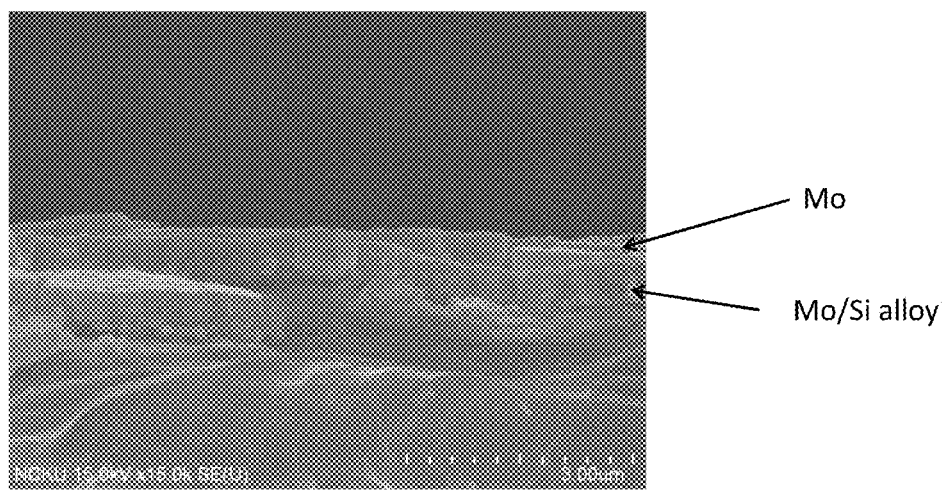
FIG. 14 is an SEM image corresponding to Example 5 of the present invention.

Silicon powder with a weight of 1 kg and an average particle size of 150 nm was added into 9 kg of de-ionized water, which was uniformly stirred by a DC mixer to prepare a silicon-containing fluid with a solid content of 10%. Then, the silicon-containing fluid was transported by high-pressure carrier gas to a nozzle outlet so that the silicon-containing fluid can be sprayed onto the surface of molybdenum metal (Mo). In this example, the carrier gas is argon with a gas pressure is 7 Bar. After that, the sample was put into a high-temperature vacuum furnace. The pressure of the vacuum furnace was then down to $5\times10^{-1}$ torr, and the temperature of the furnace was increased to 2000° C. and kept for 30 minutes so as to produce molybdenum-silicon alloy on the surface of Mo (metallic substrate). The corresponding SEM image is shown in FIG. 14.

Example 6

Figure 15:
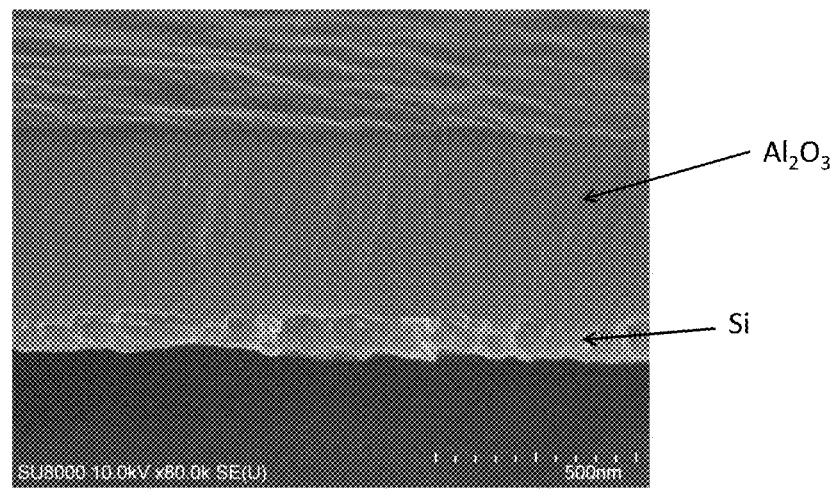
FIG. 15 is an SEM image corresponding to Example 6 of the present invention.

Silicon powder with the weight of 1 kg and the average particle size of 120 nm was added into 4 kg of de-ionized water, which was uniformly stirred by a DC mixer to prepare a silicon-containing fluid with a solid content of 20%. Then, the silicon-containing fluid was dripped onto the surface of alumina, and then the surface of alumina was coated by applying a spin coating method at the maximum rotating speed of 1000 RPM. Then, the sample coated with silicon-containing fluid was put into a high-temperature vacuum furnace. The pressure of the vacuum furnace was then down to $5\times10^{-1}$ torr, and the temperature of the furnace was increased to 900° C. and kept for 30 minutes so as to produce a silicon film on the surface of alumina (insulating substrate). The corresponding SEM image is shown in FIG. 15.

Example 7

Figure 16:
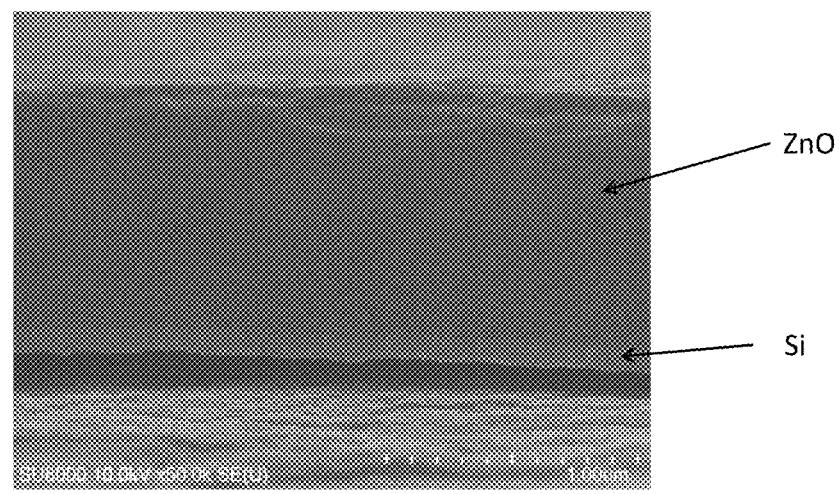
FIG. 16 is an SEM image corresponding to Example 7 of the present invention.

Silicon powder with the weight of 1 kg and an average particle size of 120 nm was added to 4 kg of de-ionized water, which was uniformly stirred by a DC mixer to prepare a silicon-containing fluid with a solid content of 20%. Then, the silicon-containing fluid was dripped onto the surface of zinc oxide, and then the surface of zinc oxide was treated by applying a spin coating method at the maximum rotating speed of 1000 RPM. After that, the sample coated with silicon-containing fluid was put into a high-temperature vacuum furnace. The pressure of the vacuum furnace was then down to $5 \times 10^{-1}$ torr, and the temperature of the furnace was increased to 900° C. and kept for 30 minutes so as to produce a silicon film on the surface of zinc oxide (semiconductor substrate). The corresponding SEM image is shown in FIG. 16.

Example 8

Figure 17:
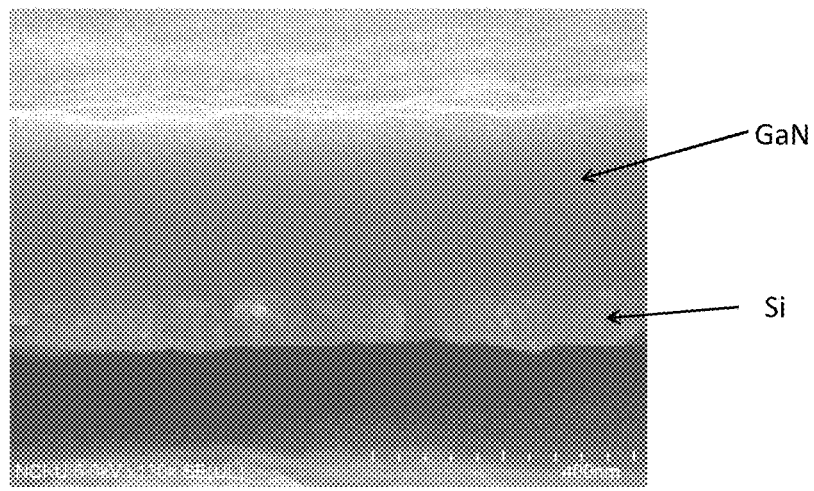
FIG. 17 is an SEM image corresponding to Example 8 of the present invention.

Silicon powder with a weight of 1 kg and an average particle size of 120 nm was added to 4 kg of de-ionized water, which was uniformly stirred by a DC stirrer to prepare a silicon-containing fluid with a solid content of 20%. Then, silicon-containing fluid was dripped onto the surface of gallium nitride, and then the surface of gallium nitride was treated by applying a spin coating method at the maximum rotating speed of 1000 RPM. After that, the sample coated with silicon-containing fluid was put into a high-temperature vacuum furnace. The pressure of the vacuum furnace was then down to $5 \times 10^{-1}$ torr, and the temperature of the furnace was increased to 900° C. and kept for 30 minutes so as to produce a silicon film on the surface of gallium nitride (semiconductor substrate). The corresponding SEM image is shown in FIG. 17.

Example 9

Figure 18:
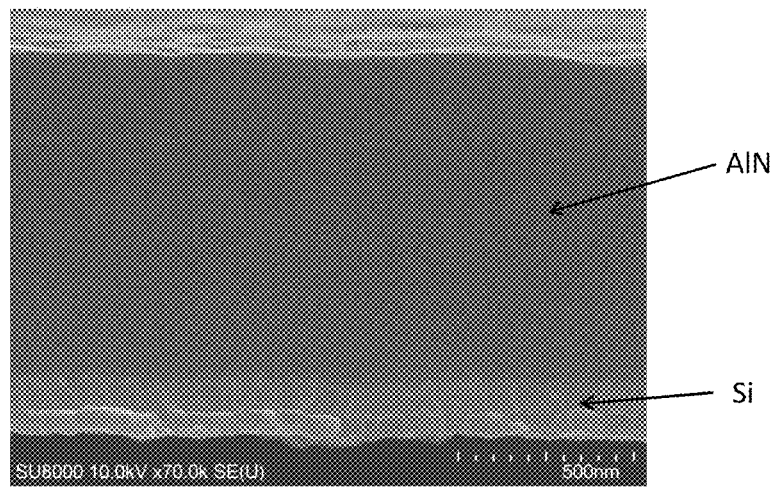
FIG. 18 is an SEM image corresponding to Example 9 of the present invention.

Silicon powder with the weight of 1 kg and 120 nm was added into 4 kg of de-ionized water, which was uniformly stirred by a DC mixer to prepare a silicon-containing fluid with a solid content of 20%. Then, the silicon-containing fluid was dripped onto the surface of aluminum nitride, and then the surface of aluminum nitride was treated by a spin coating method at the maximum rotating speed of 1000 RPM. After that, the sample coated with the silicon-containing fluid was put into a high-temperature vacuum furnace. The pressure of the vacuum furnace was then down to $5 \times 10^{-1}$ torr, and the temperature of the furnace was increased to 900° C. and kept for 30 minutes so as to produce a silicon film on the surface of aluminum nitride (semiconductor substrate). The corresponding SEM image is shown in FIG. 18.

Example 10

Figure 19:
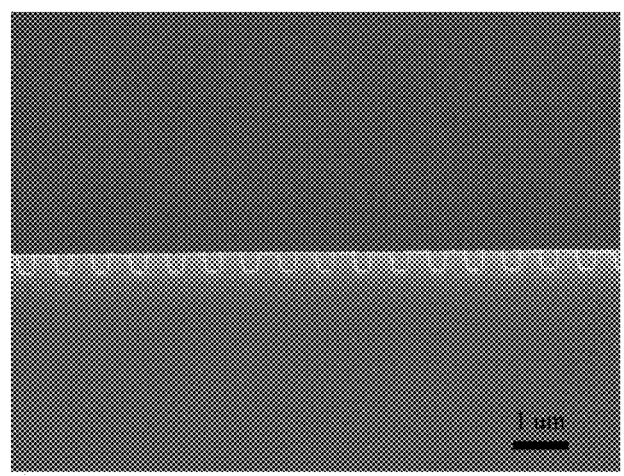
FIG. 19 is an SEM image corresponding to Example 10 of the present invention.

Silicon powder with a weight of 1 kg and an average particle size of 80 nm was added into 9 kg of de-ionized water, which was uniformly stirred by a DC stirrer to prepare a silicon-containing fluid with a solid content of 10%. Then, the silicon-containing fluid was dripped onto the surface of a patterned alumina substrate with grooves having aspect ratio (or depth-to-width ratio) of 2. After that, the sample coated with the silicon-containing fluid was put into an environment at a pressure of $1 \times 10^{-1}$ torr, thereby removing the bubbles generated between the silicon-containing fluid and the patterned alumina substrate during the process of dispersing the silicon-containing fluid in the high-aspect-ratio grooves. Then, the patterned alumina substrate was treated by a spin coating method at the maximum rotating speed of 1000 RPM so that the surface of the substrate and the bottoms of the groves were coated with the silicon-containing fluid. After that, the sample coated with the silicon-containing fluid was put into a high-temperature vacuum furnace. The pressure of the vacuum furnace was then down to $5 \times 10^{-1}$ torr, and the temperature of the furnace was increased to 900° C. and kept for 30 minutes so as to produce a silicon film on the bottoms of the grooves of the patterned alumina substrate. The corresponding SEM image is shown in FIG. 19. Referring to FIG. 19, the silicon film can be completely deposited on the bottoms of the grooves of the patterned alumina substrate (insulating substrate).

Comparative Example 1

Figure 20:
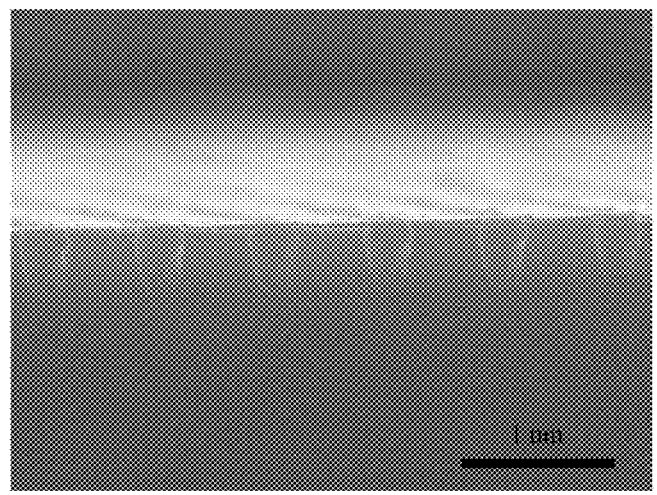
FIG. 20 is an SEM image corresponding to Comparative Example 1 of the present invention.

A patterned alumina substrate with grooves having aspect ratio of 2 was put into a sputtering apparatus. The pressure of the sputtering apparatus was then down to $3 \times 10^{-6}$ torr, the RF power is 300 W, the substrate is heated to 600° C., the rotation rate is 20 RPM. The sputtering process was performed on the sample for 30 minutes. The corresponding SEM image is shown in FIG. 20. According to FIG. 20, the silicon film cannot be completely deposited on the bottoms of the grooves of the patterned alumina substrate.

What is claimed is:

1. A method of forming a structure with a coating layer, comprising:
   providing a substrate, wherein the substrate comprises a plurality of grooves, and an aspect ratio of each of the grooves is greater than 2, wherein the plurality of grooves comprise inner walls made of metal material;
   coating a fluid on the surface of the substrate, wherein the fluid comprises a carrier and a plurality of silicon-containing nanoparticles; and
   performing a heating process to remove the carrier and convert the silicon-containing nanoparticles into one of a metal silicide layer and a stacked layer comprising a silicon-containing layer and the metal silicide layer, wherein the metal silicide layer is formed by reacting the plurality of silicon-containing nanoparticles with the inner walls of the plurality of grooves.

2. The method as claimed in claim 1, wherein the substrate is a metal substrate or a nonmetal substrate, and the nonmetal substrate comprises a semiconductor substrate or an insulator substrate.

3. The method as claimed in claim 1, wherein an average particle size of the silicon-containing nanoparticles is less than 300 nm.

4. The method as claimed in claim 1, wherein the silicon-containing layer is a polysilicon layer.

5. The method as claimed in claim 1, wherein the fluid is coated on the surface of the substrate by using a spin coating process or an air spray coating process.

6. The method as claimed in claim 1, wherein a silicide layer is formed between the silicon-containing layer and the substrate during the step of performing the heating process.

7. The method as claimed in claim 1, wherein after performing the heating process, the silicon-containing layer fills each groove and the silicon-containing layer does not comprise voids.

\* \* \* \* \*